US012742255B2

(12) United States Patent
Yang

(10) Patent No.: US 12,742,255 B2
(45) Date of Patent: Sep. 22, 2026

(54) HEATER AND SINGLE CRYSTAL GROWING APPARATUS

(71) Applicant: XI'AN ESWIN MATERIAL TECHNOLOGY CO., LTD., Xi'an (CN)

(72) Inventor: Wenwu Yang, Xi'an (CN)

(73) Assignee: XI'AN ESWIN MATERIAL TECHNOLOGY CO., LTD., Xi'an (CN)

( * ) Notice: Subject to any disclaimer, the term of this patent is extended or adjusted under 35 U.S.C. 154(b) by 257 days.

(21) Appl. No.: 18/567,705

(22) PCT Filed: Sep. 30, 2022

(86) PCT No.: PCT/CN2022/122980
§ 371 (c)(1),
(2) Date: Dec. 6, 2023

(87) PCT Pub. No.: WO2023/226269
PCT Pub. Date: Nov. 30, 2023

(65) Prior Publication Data

US 2024/0279841 A1 Aug. 22, 2024

(30) Foreign Application Priority Data

May 26, 2022 (CN) ......................... 202210588892.6

(51) Int. Cl.
*C30B 15/14* (2006.01)
*C30B 29/06* (2006.01)

(52) U.S. Cl.
CPC .............. *C30B 15/14* (2013.01); *C30B 29/06* (2013.01)

(58) Field of Classification Search
CPC ....... C30B 15/14; C30B 15/305; C30B 29/06; Y02E 10/546
See application file for complete search history.

(56) References Cited

U.S. PATENT DOCUMENTS 5,820,649 A 10/1998 Ogure et al.
6,355,910 B1 3/2002 Seidl et al.
2005/0205004 A1* 9/2005 Sakurada ............... C30B 15/14 117/200

FOREIGN PATENT DOCUMENTS

CN 202030860 U 11/2011
CN 103628129 A 3/2014
(Continued)

OTHER PUBLICATIONS

Japanese Office Action corresponding to Japanese Patent Application No. 2023-507476, dated Aug. 15, 2024. (3 Pages).
(Continued)

*Primary Examiner* — Hua Qi
(74) *Attorney, Agent, or Firm* — Maginot, Moore & Beck LLP

(57) ABSTRACT

A heater that may be included in a single crystal growing apparatus includes a heating body. The heating body has a bowl shape and has a bottom having an opening. The heating body is divided into a first heating zone and a second heating zone in the circumferential direction. The first heating zone includes a first main heating area and the second heating zone includes a second main heating area. The first main
(Continued)

heating area and the second main heating area are located at different position with different heights in the axial direction of the heating body.

14 Claims, 2 Drawing Sheets

(56) References Cited

FOREIGN PATENT DOCUMENTS

| | | | | | |
|---|---|---|---|---|---|
| CN | 203923445 U | * | 11/2014 | | |
| CN | 206015144 U | | 3/2017 | | |
| CN | 110172730 A | | 8/2019 | | |
| CN | 111733447 A | | 10/2020 | | |
| CN | 211713246 U | | 10/2020 | | |
| CN | 214496546 U | | 10/2021 | | |
| CN | 114875478 A | | 8/2022 | | |
| CN | 217556347 U | | 10/2022 | | |
| JP | H10158088 A | | 6/1998 | | |
| JP | 2004217502 A | | 8/2004 | | |
| KR | 100831809 B1 | * | 5/2008 | ............. | C30B 29/06 |
| KR | 20150030373 A | | 3/2015 | | |

OTHER PUBLICATIONS

English Translation of Japanese Office Action corresponding to Japanese Patent Application No. 2023-507476, dated Aug. 15, 2024. (4 Pages).
Machine English Translation of CN202030860U. (17 Pages).
German Office Action corresponding to German Patent Application No. 11 2022 002 302.3, dated May 14, 2025. (8 Pages).
Written Opinion and International Search Report of the International Search Authority corresponding to International Application No. PCT/CN2022/122980, dated Dec. 20, 2022. (9 pages).
English Translation of Written Opinion and International Search Authority corresponding to International Application No. PCT/CN2022/122980, dated Dec. 20, 2022. (6 pages).
Chinese Office Action corresponding to Chinese Patent Application No. 202210588892.6, dated Apr. 28, 2023. (8 Pages).
English Translation of Chinese Office Action corresponding to Chinese Patent Application No. 202210588892.6, dated Apr. 28, 2023. (8 Pages).
Taiwanese Office Action corresponding to Taiwanese Patent Application No. 111134426, dated Jan. 10, 2024. (5 Pages).
English Translation of Taiwanese Office Action corresponding to Taiwanese Patent Application No. 111134426, dated Jan. 10, 2024. (2 Pages).
Korean Office Action corresponding to Korean Patent Application No. 10-2023-7004451, dated Feb. 14, 2024. (6 Pages).
English Translation of Korean Office Action corresponding to Korean Patent Application No. 10-2023-7004451, dated Feb. 14, 2024. (5 Pages).
Machine English Translation of CN103628129A. (12 Pages).
Machine English Translation of CN206015144U. (13 Pages).
Machine English Translation of CN203923445U. (9 Pages).
Machine English Translation of CN114875478A. (12 Pages).
Machine English Translation of CN111733447A. (25 Pages).
Machine English Translation of CN110172730A. (21 Pages).
Machine English Translation of JP2004217502A. (17 Pages).
Machine English Translation of CN217556347U. (11 Pages).
Machine English Translation of CN214496546U. (18 Pages).
Machine English Translation of CN211713246U. (11 Pages).
Machine English Translation of KR100831809B1. (17 Pages).
Machine English Translation of KR20150030373A. (7 Pages).

* cited by examiner

HEATER AND SINGLE CRYSTAL GROWING APPARATUS

CROSS-REFERENCE TO RELATED APPLICATIONS

This disclosure is the U.S. national phase of PCT Application No. PCT/CN2022/122980 filed on Sep. 30, 2022, which claims a priority to Chinese Patent Application No. 202210588892.6 filed on May 26, 2022, the disclosures of which are incorporated in their entirety by reference herein.

TECHNICAL FIELD

The present disclosure relates to the technical field of single crystal preparation, and specifically to a heater and a single crystal growing apparatus.

BACKGROUND

With the continuous improvement of the quality requirements for semiconductor silicon wafers, there are high requirements for control of crystal defects in silicon ingots during growth of the single crystal, and the structure and performance of the Hot Zone directly affect the quality of silicon ingots, so the design of the hot zone is very important.

SUMMARY

In view of the above, the present disclosure provides a heater and a single crystal growing apparatus using the same, which can solve the problem of low quality of crystal ingots due to the heating efficiency of the heater in the related technology is not high, which is not conducive to the effective precipitation of oxygen and the radially uniform immersion of oxygen in the crystal ingots.

To solve the above technical problems, the present disclosure provides the following technical solutions.

An embodiment of the first aspect of the present disclosure provides a heater which comprising a heating body;

in which the heating body is of a bowl shape which is adapted to a shape of a crucible, and a bottom of the heating body is provided with an opening; and in which the heating body is provided with a first heating zone and a second heating zone in a circumferential direction, the first heating zone comprises a first main heating area and the second heating zone comprises a second main heating area, and the first main heating area and the second main heating area are located at different positions with different heights in an axial direction of the heating body.

Optionally, the heating body comprises a straight cylinder portion and an arc-shaped portion which are arranged up and down in the axial direction of the heating body and integrated as a whole; and in which the first main heating area in the first heating zone is located in the straight cylinder portion, and the second main heating area in the second heating zone is located in the arc-shaped portion.

Optionally, the heating body is provided with first slots and second slots which are alternately distributed in the circumferential direction to divide the heating body into a plurality of heating strips connected to each other in an end-to-end manner; so that the first slots extend from an upper end of the heating body to a lower end of the heating body and do not penetrate through the lower end of the heating body, and the second slots extend from the lower end of the heating body to the upper end of the heating body and do not penetrate through the upper end of the heating body; and in which the second slots located in the first heating zone extend to an area between two adjacent first slots, and the first slots located in the second heating zone extend to an area between two adjacent second slots.

Optionally, a ratio of a length of a portion of the second slot extending to the area between two adjacent first slots to the height of the straight cylinder portion is in a range from ½ to ⅔.

Optionally, a ratio of a length of a portion of the first slot extending to the area between two adjacent second slots to an arc length of the arc-shaped portion is ¾.

Optionally, a length of a portion of the first slot extending to the area between two adjacent second slots is greater than a length of a portion of the second slot extending to the area between two adjacent first slots.

Optionally, a height of the straight cylinder portion is less than an arc length of the arc-shaped portion.

Optionally, the first heating zone and the second heating zone are obtained through dividing the heating body equally in the circumferential direction.

An embodiment of another aspect of the present disclosure provides a single crystal growing apparatus which comprises the heater described in the first aspect.

Optionally, the single crystal growing apparatus further comprises a crucible, in which both the crucible and the heating body of the heater are of a bowl shape.

DETAILED DESCRIPTION

In order to illustrate the purposes, technical solution and advantages in the embodiments of the present disclosure in a clearer manner, the technical solutions in the embodiments of the present disclosure will be described hereinafter in conjunction with the drawings in the embodiments of the present disclosure in a clear and complete manner. Obviously, the following embodiments relate to a part of, rather than all of, the embodiments of the present disclosure. Based on the described embodiments of the present disclosure, a person skilled in the art may obtain other embodiments, which also fall within the scope of the present disclosure.

The heater is responsible for the heat output of a single crystal growing apparatus and plays an important role in both the melting stage of polycrystalline silicon feedstocks and the later growing stage. The shape of the heater and the size of a heating area directly affect the thermal field in the single crystal growing apparatus, which then affects the quality of silicon ingots. The heating efficiency of a heater in the related technology is not high, especially in the later stage of the body growing of silicon ingots, with the continuous reduction of the melt, the ability of the melt to retain heat was decreasing, which aggravates the non-uniformity of the temperature field of the melt to a great extent. At the same time, due to limitations on the way for transferring heat of the conventional heater, the convection way for transferring heat is not conducive to the effective precipitation of oxygen and the radial uniform immersion of oxygen in the crystal ingots, which largely degrades the uniform distribution of oxygen in the crystal ingots and affects the overall quality of crystal ingots.

Figure 1:
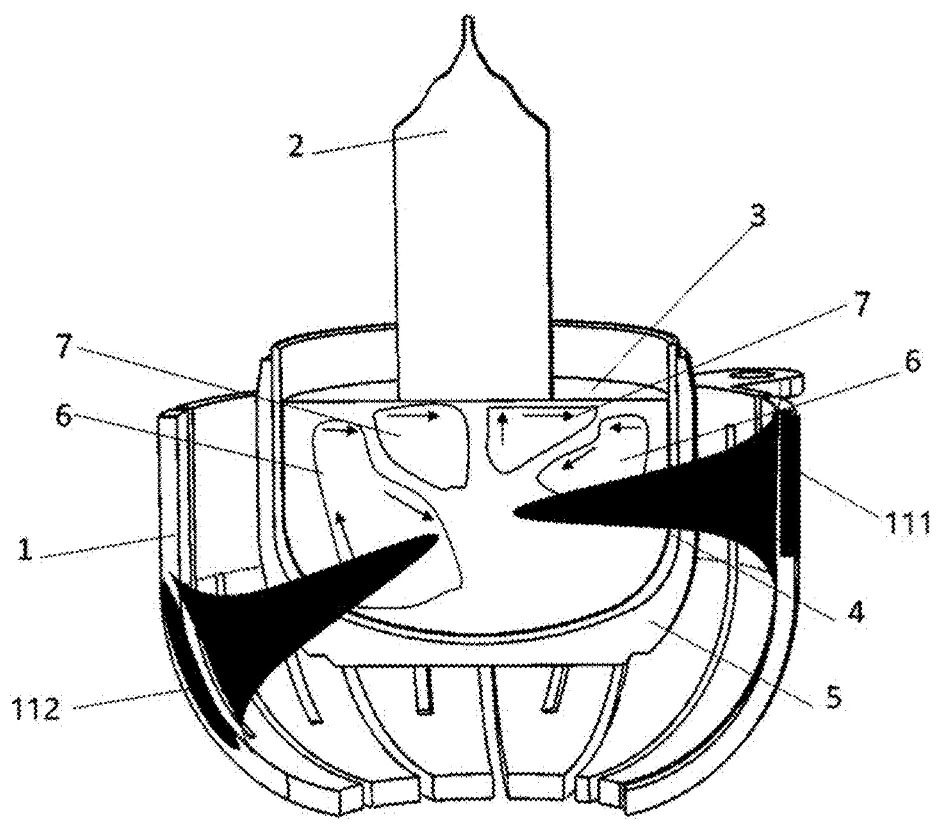
FIG. 1 is an assembly schematic diagram of the heater according to an embodiment of the present disclosure.
Figure 2:
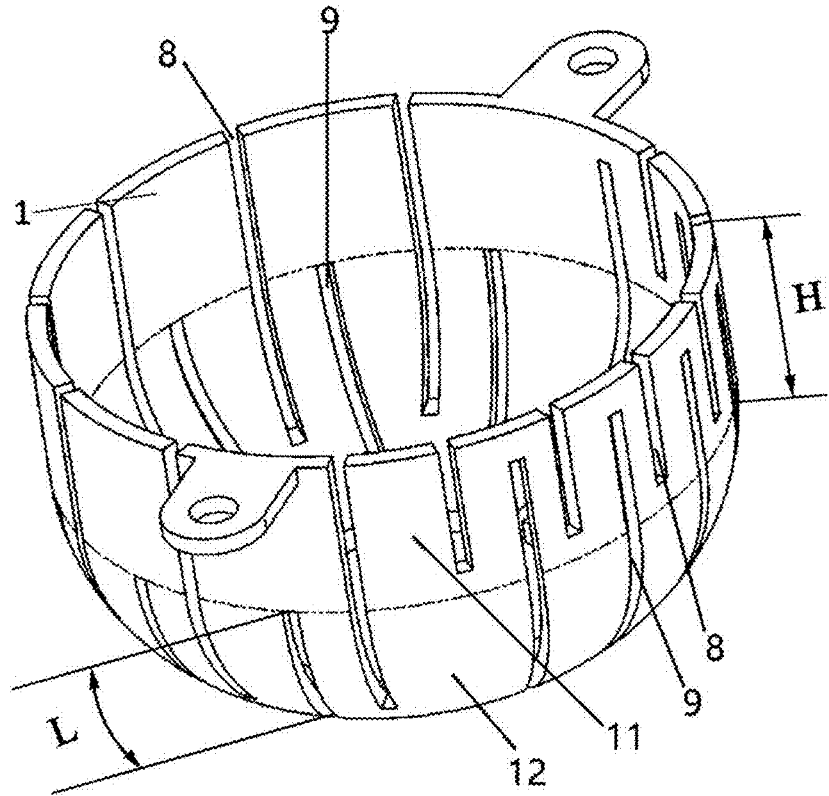
FIG. 2 is a schematic diagram of a heating body according to an embodiment of the present disclosure.

Refer to FIG. 1 and FIG. 2, FIG. 1 is an assembly schematic diagram of a heater according to an embodiment of the disclosure, and FIG. 2 is a schematic diagram of a heating body according to an embodiment of the disclosure. As shown in FIG. 1 and FIG. 2, an embodiment in an aspect of the present disclosure provides a heater which is applied to a single crystal growing apparatus. The heater comprises a heating body 1, and the heating body 1 is of a bowl shape adapted to the shape of the crucible. That is to say, the crucible used to hold the silicon feedstocks in the single crystal growing apparatus is of a bowl shape. The crucible may be specifically a graphite crucible 5. The heating body 1 of the heater also has the same bowl shape as the crucible, which is equivalent to enlarge the graphite crucible 5 in equal proportions. Therefore, the distances between different portions of the heating body 1 and the corresponding portions of the crucible are basically the same, the heat generated by the heating body 1 may be uniformly transmitted to the crucible, and then the heat is uniformly transferred by the crucible to the silicon material in the crucible, thereby the heating efficiency of the heater is improved.

In the embodiment of the present disclosure, the heating body 1 is provided with a first heating zone and a second heating zone in the circumferential direction. The first heating zone comprises a first main heating area 111, and the heating power of the first main heating area 111 is greater than the heating power of other areas in the first heating zone except the first main heating area 111. Optionally, the first main heating area 111 and the other areas in the first heating zone are arranged up and down. The second heating zone comprises a second main heating area 112, and the heating power of the second main heating area 112 is greater than the heating power of other areas in the second heating zone except the second main heating area 112. Optionally, the second main heating area 112 and the other areas in the second heating zone are arranged up and down. Moreover, the first main heating area 111 and the second main heating area 112 are located at different positions with different heights in the axial direction of the heating body 1. That is, the heights of the first main heating area 111 in the first heating zone and the second main heating area 112 in the second heating zone in the axial direction of the heating body 1 are different. The first main heating area 111 and the second main heating area 112 exhibit asymmetry in the circumferential direction. As shown in FIG. 1, the heating direction formed by the first main heating area 111 is mainly lateral radiation, while the heating direction formed by the second main heating area 112 is mainly oblique upward radiation. The melt 3 during the heating process will generate an outer natural convection 6, and the melt 3 will generate an inter forced convection 7 under the action of the rotation of crystal ingot 2.

Therefore, the heater in the embodiment of the present disclosure adopts the above-mentioned configuration, which are conducive to reduce the difference ΔG between the axial temperature difference at the center of the crystal ingot 2 and the axial temperature difference at the edge of the crystal ingot 2, so that the shape of the solid-liquid interface becomes smooth, which is conducive to the growth of defect-free crystal ingots; and the outer natural convection 6 of the melt 3 may also be varied so as the effective precipitation of oxygen may be controlled with the rotation speed of the crucible itself. In addition, the surface tension of the melt 3 may also be varied to vary as a gradient along the radial direction to form interfacial convection, which cooperates with the inner forced convection 7 formed by the rotation of the crystal ingot 2 to facilitate uniform immersion of oxygen into the crystal ingot 2, and the uniformities of the oxygen content in both the axial direction and the radial direction of the crystal ingot 2 can be improved, thereby the quality of the crystal ingot 2 is improved.

The beneficial effects of the above-mentioned technical solutions of the present disclosure are as follows. The heater according to an embodiment of the present disclosure, by setting the shape of the heating body to a bowl shape adapted to the shape of the crucible, may efficiently transfer heat to the crucible and improve the heating efficiency of the heater; and among the first heating zone and the second heating zone divided in the circumferential direction of the heating body, the heights of the first main heating area comprised in the first heating zone and the second main heating area comprised in the second heating zone in the axial direction of the heating body are different, in other words, it exhibits asymmetry between the first main heating area and the second main heating area. Thus, it is conducive to make the difference between the axial temperature difference at the center of the crystal ingot and the axial temperature difference at the edge of the crystal ingot become smaller, so that the shape of the solid-liquid interface becomes smooth, which is conducive to the growth of defect-free crystal ingots. At the same time, the outer natural convection of the melt is varied, and the effective precipitation of oxygen may be controlled with the rotation speed of the crucible. Moreover, the surface tension of the melt is changed so that an interfacial convection is formed by making surface tension change in gradient along the radial direction, which cooperates with the inner convection formed by the rotation of crystal ingots to facilitate uniform immersion of oxygen into crystal ingots, and the uniformity of oxygen content in both the axial direction and the radial direction of the crystal ingot is improved.

In some embodiments of the present disclosure, the heating body 1 comprises a straight cylinder portion 11 and an arc-shaped portion 12 that are arranged up and down in the axial direction of the heating body 1 and integrated as a whole. That is, the straight cylinder portion 11 is located on the top of the arc-shaped portion 12. The straight cylinder portion 11 is of a shape of a straight cylinder, and the arc-shaped portion 12 is of an arc shape. The first main heating area 111 in the first heating zone is located in the straight cylinder portion 11, and the second main heating area 112 in the second heating zone is located in the arc-shaped portion 12. Thus, the first main heating area 111 and the second main heating area 112 are located at different position with different heights in the axial direction of the heating body 1 to achieve asymmetrical arrangement.

In some embodiments of the present disclosure, the heating body 1 is provided with first slots 8 and second slots 9 which are alternately distributed in the circumferential direction. The first slots 8 and the second slots 9 divide the heating body 1 into a plurality of heating strips which connect to each other in an end-to-end manner, that is, the plurality of heating strips connects in series. The first slots 8 extend from the upper end of the heating body 1 to the lower end of the heating body 1 and do not penetrate through the lower end of the heating body 1, while the second slots 9 extend from the lower end of the heating body 1 to the upper end of the heating body 1 and do not penetrate through the upper end of the heating body 1. The second slots 9 located in the first heating zone extend to the area between two adjacent first slots 8, that is, the portion of the second slots 9 in the first heating zone is located in the area between two adjacent first slots 8. The first slots 8 located in the second heating zone extend to the area between two adjacent second slots 9, that is, the portion of the first slots 8 in the second heating zone is located in the area between two adjacent second slots 9. Thus, the first main heating area 111 formed by the first slots 8 and the second slots 9 in the first heating zone is located in the straight cylinder portion 11, and the second main heating area 112 formed by the first slots 8 and the second slots 9 in the second heating zone is located in the arc-shaped portion 12.

Optionally, the heating body 1 is also provided with pins for connecting with the electrodes so as to connect the heating body to an external power to realize electric heating.

In other embodiments of the present disclosure, in the first heating zone, a ratio of a length of the portion of the second slot 9 extending to the area between two adjacent first slots 8 to a height H of the straight cylinder portion 11 is in a range from ½ to ⅔. Therefore, by controlling the ratio of the length of the portion of the second slot 9 extending to the area between two adjacent first slots 8 to the height H of the straight cylinder portion 11, the area of the first main heating area 111 in the first heating zone may be controlled.

In other embodiments of the present disclosure, in the second heating zone, a ratio of a length of the portion of the first slot 8 extending to the area between two adjacent second slots 9 to the arc length L of the arc-shaped portion is about ¾. Therefore, by controlling the ratio of the length of the portion of the first slot 8 extending into the area between two adjacent second slots 9 to the arc length L of the arc-shaped portion 12, the area of the second main heating area 112 in the second heating zone may be controlled. The so-called arc length L of the arc-shaped portion 12 refers to the length of the arc between the lower end of the arc-shaped portion 12 and the upper end of the arc-shaped portion 12, and the arc is obtained by sectioning the arc-shaped portion 12 in a across-sectional plane across the axis of the heating body 1.

In some embodiments of the present disclosure, the length of the portion of the first slot 8, in the second heating zone, extending to the area between two adjacent second slots 9 is greater than the length of the portion of the second slots 9, in the first heating zone, extending into the area between two adjacent first slots 8. That is to say, the heating efficiency of the second main heating area 112 in the second heating zone is greater than the heating efficiency of the first main heating area 111 in the first heating zone, which is conducive to effective precipitation of oxygen and uniform immersion of oxygen in the crystal ingots 2 in radial direction.

In other embodiments of the present disclosure, the height H of the straight cylinder portion 11 is less than the arc length L of the arc-shaped portion 12. The so-called arc length L of the arc-shaped portion 12 refers to the length of the arc between the lower end of the arc-shaped portion 12 and the upper end of the arc-shaped portion 12, and the arc is obtained by sectioning the arc-shaped portion 12 in a across-sectional plane across the axis of the heating body 1. Therefore, the heating range of the arc-shaped portion 12 in the axial direction of the heating body 1 is greater than the heating range of the straight cylinder portion 11 in the axial direction of the heating body 1, that is, the heating efficiency of the arc-shaped portion 12 is greater than that of the straight cylinder portion 11. Thus, the outer natural convection 6 of the melt 3 and the inner convection formed by the rotation of the crystal are improved.

In some embodiments of the present disclosure, the first heating zone and the second heating zone are obtained through dividing the heating body 1 equally in the circumferential direction, that is, the first heating zone and the second heating zone have the same length in the circumferential direction of the heating body 1. Of course, optionally, in some embodiments, the lengths of the first heating zone and the second heating zone in the circumferential direction of the heating body 1 may also be different. For example, the length of the first heating zone in the circumferential direction of the heating body 1 accounts for about ⅓ of the circumferential length of the heating body 1, and the length of the second heating zone in the circumferential direction of the heating body 1 accounts for about ⅔ of the circumferential length of the heating body 1. The specific size may be determined according to the actual design requirements of the single crystal growing apparatus, and the embodiments of the present disclosure do not make specific limitations.

In the embodiment of the present disclosure, the heat may be efficiently transferred to the crucible and the heating efficiency of the heater is improved by setting the shape of the heating body 1 to a bowl shape adapted to the shape of the crucible. In addition, among the first heating zone and the second heating zone provided in the circumferential direction of the heating body, the heights of the first main heating area comprised in the first heating zone and the second main heating area comprised in the second heating zone in the axial direction of the heating body are different, i.e., they exhibit asymmetry. Thus, the difference between the axial temperature difference at the center of the crystal ingot and the axial temperature difference at the edge of the crystal ingot becomes smaller, so that the shape of the solid-liquid interface becomes smooth, which is conducive to the growth of defect-free crystal ingots. At the same time, the outer natural convection of the melt is varied, and the effective precipitation of oxygen may be controlled with the rotation speed of the crucible. Moreover the surface tension of the melt is varied to vary as a gradient along the radial direction to form an interfacial convection, which cooperates with the inner forced convection formed by the rotation of crystal ingot to facilitate uniform immersion of oxygen into the crystal ingot, and the uniformities of oxygen content in both the axial direction and the radial direction of the crystal ingot is improved.

An embodiment of another aspect of the present disclosure further provides a single crystal growing apparatus which comprises the heater of the above embodiments, and can achieve the same technical effect. To avoid repetition, details are not repeated here.

In some embodiments of the present disclosure, the single crystal growing apparatus further comprises a crucible, both the crucible and the heating body 1 of the heater having a bowl shape.

Specifically, as shown in FIG. 1 and FIG. 2, the heater comprises a heating body 1, and the heating body 1 is of a bowl shape adapted to the shape of the crucible. That is to say, the crucible used to hold the silicon feedstocks in the single crystal growing apparatus is of a bowl shape, and the crucible may specifically comprise a graphite crucible 5 and a quartz crucible 4 located inside the graphite crucible 5, and the heating body 1 of the heater is also in a bowl shape with the similar shape as the graphite crucible 5, which is equivalent to enlarged the graphite crucible 5 in equal proportions. Therefore, the distances between different portions of the heating body 1 and the corresponding portions of the crucible are basically the same, the heat generated by the heating body 1 may be uniformly transmitted to the crucible, and then the heat is uniformly transferred by the crucible to the silicon feedstocks in the crucible, thereby the heating efficiency of the heater is improved.

In the embodiments of the present disclosure, the heat may be efficiently transferred to the crucible and the heating efficiency of the heater is improved by setting the shape of the heating body of the heater to a bowl shape adapted to the shape of the crucible. In addition, among the first heating zone and the second heating zone provided in the circumferential direction of the heating body, the heights of the first main heating area comprised in the first heating zone and the second main heating area comprised in the second heating zone located in the axial direction of the heating body are different, i.e., they exhibit asymmetry. Thus, the difference between the axial temperature difference at the center of the crystal ingot and the axial temperature difference at the edge of the crystal ingot becomes smaller, so that the shape of the solid-liquid interface becomes smooth, which is conducive to the growth of defect-free crystal ingots. At the same time, the outer natural convection of the melt is varied, and the effective precipitation of oxygen may be controlled with the rotation speed of the crucible. Moreover the surface tension of the melt is varied to vary as a gradient along the radial direction to form an interfacial convection, which cooperates with the inner convection formed by the rotation of crystal ingot to facilitate uniform immersion of oxygen into the crystal ingot and the uniformities of oxygen content in both the axial direction and the radial direction of the crystal ingot is improved.

The above descriptions are a part of embodiments of the present disclosure. It should be noted that one skilled in the art would make several improvements and modifications without departing from the principles of the present disclosure. These improvements and modifications should also be regarded as the protection scope of the present disclosure.

What is claimed is:

1. A heater comprising a heating body;

wherein the heating body has a bowl shape which is adapted to a shape of a crucible, distances between different portions of the heating body and corresponding portions of the crucible are the same, and a bottom of the heating body is provided with an opening;

wherein the heating body is provided with a first heating zone and a second heating zone in a circumferential direction, the first heating zone comprises a first main heating area and the second heating zone comprises a second main heating area, and the first main heating area and the second main heating area are located at different positions with different heights in an axial direction of the heating body, wherein the heating body comprises a straight cylinder portion and an arc-shaped portion which are arranged up and down in the axial direction of the heating body and integrated as a whole, the first main heating area in the first heating zone is located in the straight cylinder portion, and the second main heating area in the second heating zone is located in the arc-shaped portion, and wherein a heating efficiency of the second main heating area in the second heating zone is greater than the heating efficiency of the first main heating area in the first heating zone; a heating power of the first main heating area is greater than the heating power of other areas in the first heating zone except the first main heating area; the heating power of the second main heating area is greater than the heating power of other areas in the second heating zone except the second main heating area.

2. The heater according to claim 1, wherein the heating body is provided with first slots and second slots which are alternately distributed in the circumferential direction to divide the heating body into a plurality of heating strips connected to each other in an end-to-end manner;

wherein the first slots extend from an upper end of the heating body to a lower end of the heating body and do not penetrate through the lower end of the heating body, the second slots extend from the lower end of the heating body to the upper end of the heating body and do not penetrate through the upper end of the heating body; and wherein the second slots located in the first heating zone extend to an area between two adjacent first slots, and the first slots located in the second heating zone extend to an area between two adjacent second slots.

3. The heater according to claim 2, wherein a ratio of a length of a portion of each of the second slots extending to the area between the two adjacent first slots to a height of the straight cylinder portion is in a range from ½ to ⅔.

4. The heater according to claim 2, wherein a ratio of a length of a portion of each of the first slots extending to the area between two adjacent second slots to an arc length of the arc-shaped portion is ¾.

5. The heater according to claim 2, wherein a length of a portion of each of the first slots extending to the area between the two adjacent second slots is greater than a length of a portion of each of the second slots extending to the area between the two adjacent first slots.

6. The heater according to claim 1, wherein a height of the straight cylinder portion is less than an arc length of the arc-shaped portion.

7. The heater according to claim 1, wherein the first heating zone and the second heating zone are obtained through dividing the heating body equally in the circumferential direction.

8. A single crystal growing apparatus comprising a heater, wherein the heater comprises a heating body;

wherein the heating body has a bowl shape which is adapted to a shape of a crucible, distances between different portions of the heating body and corresponding portions of the crucible are the same, and a bottom of the heating body is provided with an opening; and wherein the heating body is provided with a first heating zone and a second heating zone in a circumferential direction, the first heating zone comprises a first main heating area and the second heating zone comprises a second main heating area, and the first main heating area and the second main heating area are located at different positions with different heights in an axial direction of the heating body, wherein the heating body comprises a straight cylinder portion and an arc-shaped portion which are arranged up and down in the axial direction of the heating body and integrated as a whole, the first main heating area in the first heating zone is located in the straight cylinder portion, and the second main heating area in the second heating zone is located in the arc-shaped portion, and wherein a heating efficiency of the second main heating area in the second heating zone is greater than the heating efficiency of the first main heating area in the first heating zone; a heating power of the first main heating area is greater than the heating power of other areas in the first heating zone except the first main heating area; the heating power of the second main heating area is greater than the heating power of other areas in the second heating zone except the second main heating area.

9. The single crystal growing apparatus according to claim 8, wherein the heating body is provided with first slots and second slots which are alternately distributed in the circumferential direction to divide the heating body into a plurality of heating strips connected to each other in an end-to-end manner;

wherein the first slots extend from an upper end of the heating body to a lower end of the heating body and do not penetrate through the lower end of the heating body, the second slots extend from the lower end of the heating body to the upper end of the heating body and do not penetrate through the upper end of the heating body; and wherein the second slots located in the first heating zone extend to an area between two adjacent first slots, and the first slots located in the second heating zone extend to an area between two adjacent second slots.

10. The single crystal growing apparatus according to claim 9, wherein a ratio of a length of a portion of each of the second slots extending to the area between the two adjacent first slots to a height of the straight cylinder portion is in a range from ½ to ⅔.

11. The single crystal growing apparatus according to claim 9, wherein a ratio of a length of a portion of each of the first slots extending to the area between two adjacent second slots to an arc length of the arc-shaped portion is ¾.

12. The single crystal growing apparatus according to claim 9, wherein a length of a portion of each of the first slots extending to the area between the two adjacent second slots is greater than a length of a portion of each of the second slots extending to the area between the two adjacent first slots.

13. The single crystal growing apparatus according to claim 8, wherein a height of the straight cylinder portion is less than an arc length of the arc-shaped portion.

14. The single crystal growing apparatus according to claim 8, wherein the first heating zone and the second heating zone are obtained through dividing the heating body equally in the circumferential direction.

* * * * *